(12) United States Patent
Feldhaus et al.

(10) Patent No.: US 11,050,430 B1
(45) Date of Patent: Jun. 29, 2021

(54) SAMPLING DEVICE

(71) Applicant: Rohde & Schwarz GmbH & Co. KG, Munich (DE)

(72) Inventors: Gregor Feldhaus, Munich (DE); Alexander Roth, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/778,646

(22) Filed: Jan. 31, 2020

(51) Int. Cl.
*H03M 1/12* (2006.01)
*H03M 1/06* (2006.01)
*H03M 1/00* (2006.01)
*G01S 19/13* (2010.01)

(52) U.S. Cl.
CPC ......... *H03M 1/127* (2013.01); *H03M 1/0626* (2013.01); *G01S 19/13* (2013.01); *H03M 1/001* (2013.01); *H03M 1/12* (2013.01); *H03M 1/124* (2013.01)

(58) Field of Classification Search
CPC ........ H03M 1/12; H03M 1/001; H03M 1/124; G01S 19/13
USPC .................. 341/155, 110, 122, 126; 375/147
See application file for complete search history.

(56) References Cited

U.S. PATENT DOCUMENTS

| | | | | |
|---|---|---|---|---|
| 4,893,316 A * | 1/1990 | Janc | ......................... | H03C 3/40 341/110 |
| 5,786,778 A | 7/1998 | Adams et al. | | |
| 2006/0240790 A1* | 10/2006 | Timmis | .................. | H04B 1/034 455/127.4 |
| 2011/0150045 A1* | 6/2011 | Thompson | ............... | H04B 1/28 375/147 |
| 2012/0068768 A1* | 3/2012 | Ishikawa | ................... | H03F 3/24 330/149 |

OTHER PUBLICATIONS

Lowdermilk, W., et al., "Cost Effective, Versatile, High Performance, Spectral Analysis in a Synthetic Instrument," IEEE AUTOTESTCON, Sep. 2008, 6 pages.
Borkowski, D., et al., "Improvement of Accuracy of Power System Spectral Analysis by Coherent Resampling," IEEE Transactions on Power Delivery 24(3)1004-1013, Jul. 2009.

* cited by examiner

*Primary Examiner* — Joseph J Lauture
(74) *Attorney, Agent, or Firm* — Christensen O'Connor Johnson Kindness PLLC (57) ABSTRACT

A sampling device comprises a clock source that provides a clock frequency, a converter with a receiving port for receiving the clock frequency, and a re-sampler located in a digital domain of the sampling device. The clock source is configured to vary the clock frequency over time. The clock source is configured to forward the clock frequency to the converter in order to change a sampling rate of the converter in dependency of the clock frequency. An output sample rate of the sampling device is fixed.

21 Claims, 3 Drawing Sheets

SAMPLING DEVICE

FIELD OF THE DISCLOSURE

Embodiments of the present disclosure generally relate to a sampling device.

BACKGROUND

Modern test instruments such as oscilloscopes, signal analyzers or spectrum analyzers comprise a sampling device with high-speed converters, particularly analog-to-digital converters (ADCs), to capture an input signal, for instance a broadband input signal. However, these converters tend to generate spurious images of the input signal processed, also called image spurs. These spurs may be generated due to gain and phase mismatch of inherent interleaving. Typically, the most prominent spur occurs at a frequency that depends on the sample rate and the frequency at which the input signal is sampled. In fact, the most prominent spur $f_{spur}=f_s-2*f_{in}$. This prominent spur typically limits the spurious free dynamic range (SFDR) that is the strength ratio of the fundamental signal to the strongest spurious signal in the output signal of the test instrument.

In the state of the art, it is known to spread the spurs over a broader part of the spectrum in order to extend the spurious-free dynamic range. For instance, U.S. Pat. No. 6,124,821 A shows a method to spread the spurs, wherein a continuous frequency sweep of the input signal is performed prior to the converter, namely the analog-to-digital converter. Further, an inverse frequency sweep is done at an output of the respective converter, namely in the digital domain. Thus, the input signal is reconstructed, wherein the spurs added to the input signal by means of the converter are spread. However, the analog mixer may produce its own spurs and noise.

However, modern test instruments with high-speed converters have to sample a large frequency band directly without any mixing stage. Introducing an analog mixer in such modern test instruments would result in a significant performance degradation.

SUMMARY

Accordingly, there is a need for a sampling device that ensures high-speed sampling with an extended spurious free dynamic range.

Embodiments of the present disclosure provide a sampling device. In an embodiment, the sampling device comprises a clock source that provides a clock frequency, a converter with a receiving port for receiving the clock frequency and a re-sampler located in a digital domain of the sampling device. The clock source is configured to vary the clock frequency over time. The clock source is also configured to forward the clock frequency to the converter in order to change a sampling rate of the converter in dependency of the clock frequency. An output sample rate of the sampling device is fixed.

Accordingly, the present disclosure is based on the finding that mixing stages, for example an analog mixer, can be avoided, as the sampling rate of the converter is modified over time instead of the input signal frequency while using the respective mixing stage that mixes the input signal. The sampling rate of the converter corresponds to a time-variant sampling rate, as the sampling rate is varied over time. Generally, the time-variant sampling rate ensures to spread any occurring non-linearities within the spectrum. Therefore, the spurious-free dynamic range can be extended appropriately such that the sampling device can be used in modern test instruments requiring high-speed converters.

Generally, the converter processes an input signal with its time-variable sampling rate that depends on the time-varying clock frequency received from the clock source. The respective converter introduces non-linearities, which, however, are corrected (previously or afterwards) by means of the re-sampler in the digital domain such that the entire sampling device outputs a signal with a fixed output sample rate.

If the converter is located downstream of the re-sampler, the non-linearities are introduced after processing the signal by the re-sampler. Thus, these non-linearities are corrected previously, namely by a pre-distortion or pre-correction of the signal processed.

If the converter is located upstream of the re-sampler, the non-linearities are introduced prior to processing the signal by the re-sampler. Thus, these non-linearities are corrected afterwards, namely by a post-correction of the signal processed. The re-sampler may interpolate the respective sampling rate, ensuring the fixed output sample rate of the sampling device.

Generally, the non-linearities introduced are spread over the output spectrum of the sampling device, yielding an increased spurious-free dynamic range of the sampling device. This can be called spur spreading. Thus, the sampling device provides spur spreading.

According to an aspect, the clock frequency varying over time comprises several instantaneous clock frequencies. Since the clock frequency is time-variant, it has several different instantaneous clock frequencies. These different instantaneous clock frequencies are used when sampling the input signal, resulting in different sampling rates of the converter, namely the time-variant sampling rate. It is to be noted that the several instantaneous clock frequencies are obtained by the continuous variation of the clock frequency over time. Hence, the clock frequency varying over time corresponds to a continuous signal. Put differently, the several instantaneous clock frequencies do not relate to discrete steps. However, the clock frequency has different values while varying over time, resulting in the several instantaneous clock frequencies or several instantaneous clock frequency values.

Another aspect provides that the re-sampler has a resampling factor that corresponds to the quotient of the fixed output sample rate and an instantaneous clock frequency. The resampling factor corresponds to $$R_{Res}(t) = \frac{f_{clk,DSP}}{f_{clk,ADC}(t)},$$

wherein $f_{clk,DSP}$ is the fixed output sample rate and $f_{clk,ADC}(t)$ is the time-variant clock frequency. Thus, the resampling factor of the re-sampler is also time-variant, as it depends on the time-variant clock frequency, namely the instantaneous clock frequencies. However, the resampling factor of the re-sampler also depends on the fixed output sample rate of the sampling device. Therefore, the time-variant resampling factor ensures that the non-linearities introduced by the converter are corrected such that the fixed output sample rate of the sampling device can be ensured.

The clock source may be configured to forward the clock frequency to the re-sampler. Thus, the re-sampler is enabled to process the clock frequency, for example the instantaneous clock frequencies, in order to adapt its resampling factor in an appropriate manner, namely in a time-variant manner.

Moreover, the clock source may be provided by a direct-digital-synthesis (DDS) circuit or module configured to perform a direct-digital-synthesis for providing the clock frequency. The direct-digital-synthesis is a process employed by a frequency synthesizer that is used for creating an arbitrary waveform from a reference clock, for example a single, fixed-frequency reference clock.

In some embodiments, the direct-digital-synthesis module is assigned to a digital signal processor (DSP). In some embodiments, the digital signal processor may be established by a Field Programmable Gate Array (FPGA), which provides the clock frequency to the re-sampler and the converter. Of course, other configurations are possible.

Moreover, the clock source may be independent from other sources in the digital signal processor. The digital signal processor comprises many different sources used for different purposes. However, the clock source used for providing the clock frequency to the converter is independent from any other source of the digital signal processor, ensuring no interactions. However, the instantaneous clock frequency has to be determined for providing the respective information to the re-sampler.

For instance, the sampling device comprises a pilot signal source for providing a pilot signal of known frequency. The pilot signal is forwarded to the converter. Thus, the converter processes the pilot signal appropriately. This can be used in order to estimate or determine the clock frequency used to adapt the sampling rate of the converter.

Another aspect provides that the sampling device comprises a frequency detector in a path branched off. The frequency detector is configured to determine an instantaneous clock frequency. The instantaneous clock frequency determined is forwarded to the re-sampler. In some embodiments, the frequency detector is located in a path that is branched off with respect to the re-sampler. For instance, the frequency detector receives the pilot signal or extracts the pilot signal after having been processed by the converter in order to calculate the instantaneous clock frequency used by the converter. The frequency detector may previously determine an instantaneous frequency of the pilot signal (extracted), wherein the detected instantaneous frequency of the pilot signal is put in relation to the known frequency of the pilot signal in order to determine the instantaneous clock frequency that has been used by the converter when processing the respective signal.

In some embodiments, the frequency detector is configured to forward the instantaneous clock frequency determined to the re-sampler. The re-sampler uses the instantaneous clock frequency determined in order to adapt its resampling factor accordingly. This ensures that any non-linearities introduced by the converter can be corrected by the re-sampler, namely the time-variant resampling factor.

In some embodiments, the instantaneous clock frequency, namely the time-variant clock frequency, is determined as follows $$f_{clk,ADC}(t) = \frac{f_{Pilot,true}}{f_{Pilot,detected}(t)} * f_{clk,DSP},$$

wherein $f_{Pilot,true}$ is the known frequency of the pilot signal, $f_{Pilot,detected}(t)$ is the instantaneous frequency of the pilot signal detected by the frequency detector and $f_{clk,DSP}$ relates to the fixed output sample rate of the sampling device.

The instantaneous clock frequency determined is then used to determine the time-variant resampling factor, which corresponds to the quotient of the known frequency of the pilot signal and the instantaneous frequency of the pilot signal detected by the frequency detector, namely $$R_{Res}(t) = \frac{f_{Pilot,true}}{f_{Pilot,detected}(t)}.$$

Another aspect provides that the sampling device comprises a mixer with an input. The input is connected with a numerically controlled oscillator (NCO). The numerically controlled oscillator is assigned to the clock source. In some embodiments, the numerically controlled oscillator is connected with the clock source and the mixer, for example an NCO input of the mixer. Put differently, the numerically controlled oscillator is interconnected between the clock source and the mixer.

The mixer can be used to mix an input signal into a complex baseband associated with the frequency $f_{IF}$. The mixer may be located upstream of the re-sampler such that the numerically controlled oscillator providing the respective input of the mixer has to consider the time-variable clock frequency received from the clock source. Accordingly, the numerically controlled oscillator forwards a signal to the mixer, which has a frequency that depends on the clock frequency. The signal forwarded to the mixer may relate to a phasor that is a complex number.

Generally, the signal outputted by the numerically controlled oscillator has the time-variant frequency $$f_{NCO}(t) = -\frac{f_{IF}}{f_{clk,ADC}(t)} * f_{clk,DSP},$$

wherein $f_{IF}$ is the intermediate frequency, from which the input signal shall be mixed to the (complex) baseband. As already mentioned, $f_{clk,ADC}(t)$ is the time-variant clock frequency and f clk,DSP relates to the fixed output sample rate of the sampling device.

Another aspect provides that the sampling device comprises a first-in first-out (FIFO) circuit or module that is assigned to the converter. The FIFO module may be located upstream of the converter or downstream of the converter, which depends on the type of sampling device. In general, the FIFO module transfers the respective signal processed between different time domains. The FIFO module may also be called FIFO memory, as it temporally stores the samples.

In some embodiments, the first-in first-out module is configured to transfer a time-variant clock domain to a fixed clock domain associated with the clock source or wherein the first-in first-out module is configured to transfer a fixed clock domain associated with the clock source to a time-variant clock domain. In some embodiments, the FIFO module may be located upstream or downstream of the converter such that a respective transfer between the respective time domains can be performed.

Another aspect provides that the re-sampler is a polyphase re-sampler. In some embodiments, the re-sampler comprises several polyphase filters, for instance a polyphaser filter-bank. For instance, a farrow filter may be provided as an implementation.

Moreover, the sampling device may comprise a filter. The filter can be established by a low-pass filter or a band-pass filter. In some embodiments, the re-sampler needs a band limitation, which is usually obtained by a low-pass filter. However, the band-limitation can also be established by a band-pass filter that cuts out a specific band of the spectrum. The low-pass filter passes signals with a frequency lower than a selected cutoff frequency and attenuates signals with frequencies higher than the cutoff frequency.

In some embodiments, the filter is located upstream of the re-sampler. Thus, the respective input of the re-sampler is filtered previously. This ensures that the re-sampler requiring a certain band limitation receives the respective filtered signal that was processed previously by the filter.

For instance, the clock frequency varying over time corresponds to a linear frequency sweep, a sinusoidal frequency sweep or a periodic triangle. Different shapes of the clock frequency may be obtained while adapting the clock source in an appropriate manner. For instance, the clock source is controlled in a certain manner in order to obtain the linear frequency sweep, the sinusoidal frequency sweep or the periodic triangle. In some embodiments, the sinusoidal frequency sweep corresponds to a trade-off between resources required and optimal spur suppression.

In some embodiments, the converter is an analog-to-digital converter (ADC) or a digital-to-analog converter (DAC). Thus, the sampling device may be used for both directions, namely from the analog domain to the digital domain or vice versa.

The sampling device may be a sampling receiver that comprises an analog-to-digital converter (ADC). The re-sampler provides the fixed output sample rate of the sampling device. In other words, the re-sampler is assigned to the output of the sampling device, as the re-sampler provides the fixed output sample rate. Hence, non-linearities are compensated by means of the re-sampler afterwards, as the re-sampler is located downstream of the analog-to-digital converter.

According to another aspect, the sampling device in some embodiments is a sampling transmitter that comprises a digital-to-analog converter. The digital-to-analog converter provides the fixed output sample rate of the sampling device. Thus, the digital-to-analog converter is assigned to the output of the sampling device. In other words, the re-sampler is located upstream of the digital-to-analog converter such that non-linearities introduced by the converter are compensated previously by means of the re-sampler, which relates to a pre-distortion of the signal processed.

In general, the spurious free dynamic range (SFDR) can be increased, which results in less spurs and an improved error vector magnitude (EVM). Thus, the sampling device has reduced non-linearities, for instance spurs such as images or representations of sine signals.

Furthermore, a test instrument may be provided that comprises the sampling device as discussed above. The test instrument may be an oscilloscope, a signal analyzer, a spectrum analyzer or a signal and spectrum analyzer.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
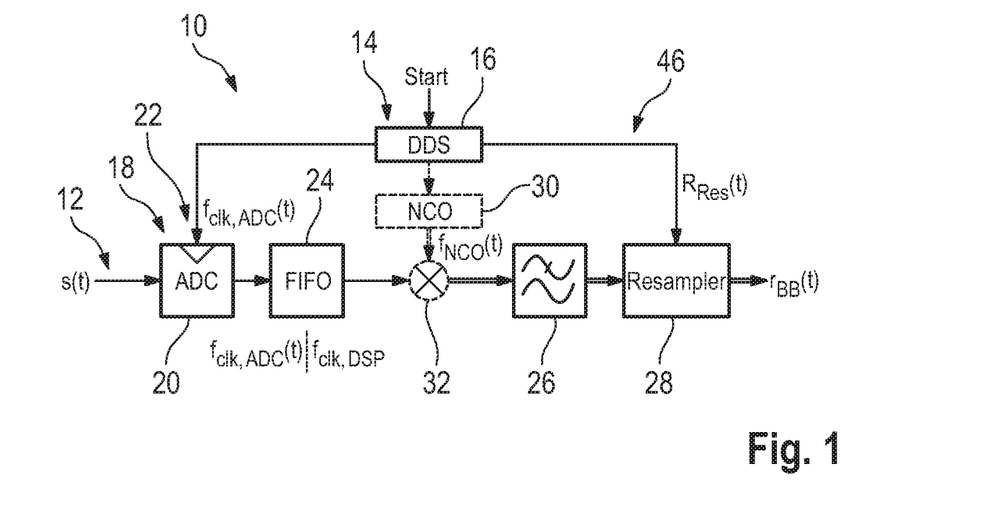
FIG. 1 shows a schematic overview of a representative sampling device according to an embodiment of the present disclosure.

FIG. 1 shows a sampling device 10 that comprises an input 12 via which an input signal s(t) is received for further processing, for example sampling. In the shown embodiment, the input signal s(t) corresponds to an analog input signal that is time-variant.

The sampling device 10 has a clock source 14 that provides a clock frequency. In the shown embodiment, the clock source 14 may be established by a direct-digital-synthesis circuit or module 16 that is configured to perform a direct-digital-synthesis for providing the clock frequency. In general, the direct-digital-synthesis is a process that may be employed by a frequency synthesizer, wherein an arbitrary waveform is created from a reference clock, for example a single, fixed-frequency reference clock. The direct-digital-synthesis module 16 may be assigned to a digital signal processor (DSP).

The sampling device 10 also comprises a converter 18 that converts the input signal. In the shown embodiment, the converter 18 is established by an analog-to-digital converter 20 that digitizes the analog input signal, thereby generating a digitized signal. Thus, the analog-to-digital converter 20 is connected with the input 12 in order to receive the input signal from the input 12. The analog-to-digital converter 20 is also abbreviated by ADC 20.

Further, the converter 18, namely the ADC 20, has a receiving port 22 via which the converter 18 receives the clock frequency provided by the clock source 14, namely the direct-digital-synthesis module 16.

In addition, the sampling device 10 comprises a first-in first-out module 24, also abbreviated by FIFO module 24.

The first-in first-out module 24 is connected with the converter 18, namely the ADC 20. The first-in first-out module 24 is configured to transfer a time-variant clock domain into a fixed clock domain, as will be described hereinafter.

In addition, the sampling device 10 comprises a filter 26 that is located downstream of the FIFO module 24. The filter 26 may be established by a low-pass filter or a band-pass filter. Generally, the filter 26 ensures that the bandwidth of the digitized signal processed is limited. For instance, a band limitation is obtained on the digitized signal by the filter 26.

Further, the sampling device 10 has a re-sampler 28 that is connected with the filter 26. Thus, the re-sampler 28 is located downstream of the filter 26 such that the re-sampler 28 receives the band-limited digitized signal.

In addition, the re-sampler 28 is connected with the clock source 14, for example the direct-digital-synthesis module 16. Thus, the re-sampler 28 may also receive the clock frequency from the clock source 14 or a representative of the clock frequency. The representative may depend on the clock frequency.

As mentioned above, the clock source 14 provides the clock frequency that is forwarded to the converter 18 that receives the clock frequency via its receiving port 22. The clock source 14 provides a time-varying clock frequency that adapts or rather changes a sampling rate of the converter 18. Put differently, the sampling rate of the converter 18 is changed in dependency of the clock frequency that is received by the converter 18 via its receiving port 22 from the clock source 14.

As the clock frequency varies over time, the clock frequency comprises several instantaneous clock frequencies that may be different.

In addition, the re-sampler 28 is also connected with the clock source 14, for example the DDS module 16, wherein the re-sampler 28 has a resampling factor that corresponds to the quotient of the fixed output sample rate of the sampling device 10 and an instantaneous clock frequency. Thus, the resampling factor is also time-variant.

In some embodiments, the resampling factor corresponds to $$R_{Res}(t) = \frac{f_{clk,DSP}}{f_{clk,ADC}(t)},$$

wherein $f_{clk,DSP}$ is the fixed output sample rate of the sampling device and $f_{clk,ADC}(t)$ is the time-variant clock frequency provided by the clock source 14.

The clock source 14, the converter 18 as well as the re-sampler 28 together ensure that the output sample rate of the entire sampling device 10 is fixed.

Hence, any non-linearities introduced by the converter 18 are compensated appropriately.

This can be ensured since the clock source 14 interacts with both the converter 18 and the re-sampler 28 appropriately. In some embodiments, the sampling rate of the converter 18 is modified by the time-variant clock frequency received. However, the resampling factor is also modified in a time-variant manner, as it also depends of the time-variant clock frequency.

The re-sampler 30 may be a polyphase re-sampler. Hence, the re-sampler 30 may comprise several polyphase filters, for instance a polyphaser filterbank. For instance, a farrow filter may be provided as an implementation.

In addition, the sampling device 10 comprises an optional numerically controlled oscillator 30 that is assigned to an optional mixer 32. As both components are optional, they illustrated by dashed lines in FIG. 1. The numerically controlled oscillator 30 is also abbreviated by NCO 30.

The numerically controlled oscillator 30 is connected with the clock source 14, for example the DDS module 16. Thus, the numerically controlled oscillator 30 also receives the clock frequency or at least a representative of the clock frequency.

The mixer 32 and the NCO 30 are used to mix down the digitized input signal to its complex baseband prior to its re-sampling performed by means of the re-sampler 28. Therefore, the mixer 32, namely the mixing stage, is located upstream of the re-sampler 28 (and the filter 26).

Accordingly, the numerically controlled oscillator 30 also has to consider the time-variable clock frequency. Thus, the NCO 30 outputs a phasor that is a complex number. In some embodiments, the NCO 30 outputs a signal that has the time-variant frequency $$f_{NCO}(t) = -\frac{f_{IF}}{f_{clk,ADC}(t)} * f_{clk,DSP},$$

wherein $f_{IF}$ is the intermediate frequency, from which the input signal shall be mixed to the (complex) baseband.

Figure 3:
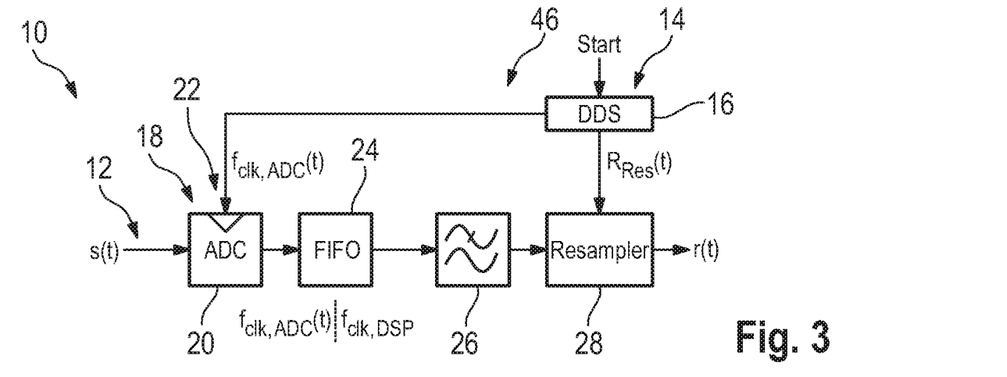
FIG. 3 shows a schematic overview of a representative sampling device according to an embodiment of the present disclosure.
Figure 4:
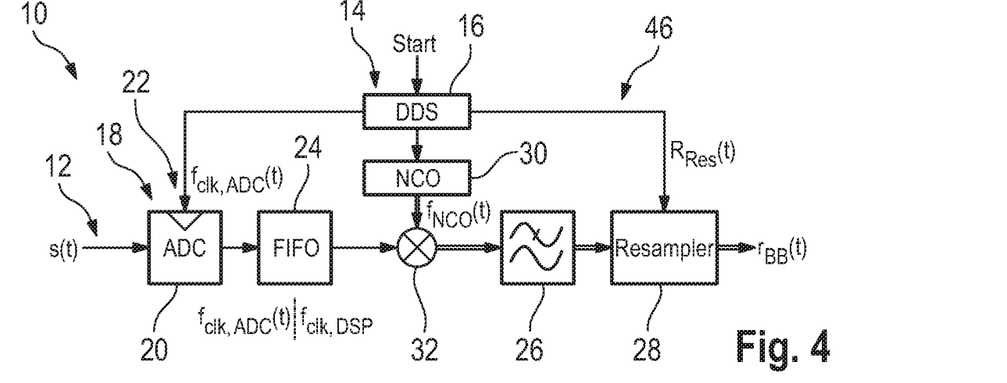
FIG. 4 shows a schematic overview of a representative sampling device according to an embodiment of the present disclosure.

In FIGS. 3 and 4, the different sampling devices 10 according to the sampling device 10 shown in FIG. 1 are illustrated separately. The sampling device 10 according to FIG. 3 provides an output signal r(t), whereas the sampling device 10 according to FIG. 4 provides a digitized output signal $r_{BB}(t)$ that is assigned to the baseband, which is indicated by the additional indices BB.

Generally, the converter 18 processes the input signal with its time-variable sampling rate that depends on the time-varying clock frequency received from the clock source 14. The converter 18 introduces non-linearities, which, however, are corrected afterwards by means of the re-sampler 28 in the digital domain such that the entire sampling device 10 outputs a signal with a fixed output sample rate, namely the output signal r(t). The output signal r(t) may be assigned to the baseband provided that the mixer 32 and the NCO 30 are provided, wherein the NCO 30 also receives the clock frequency from the clock source 14.

Figure 2:
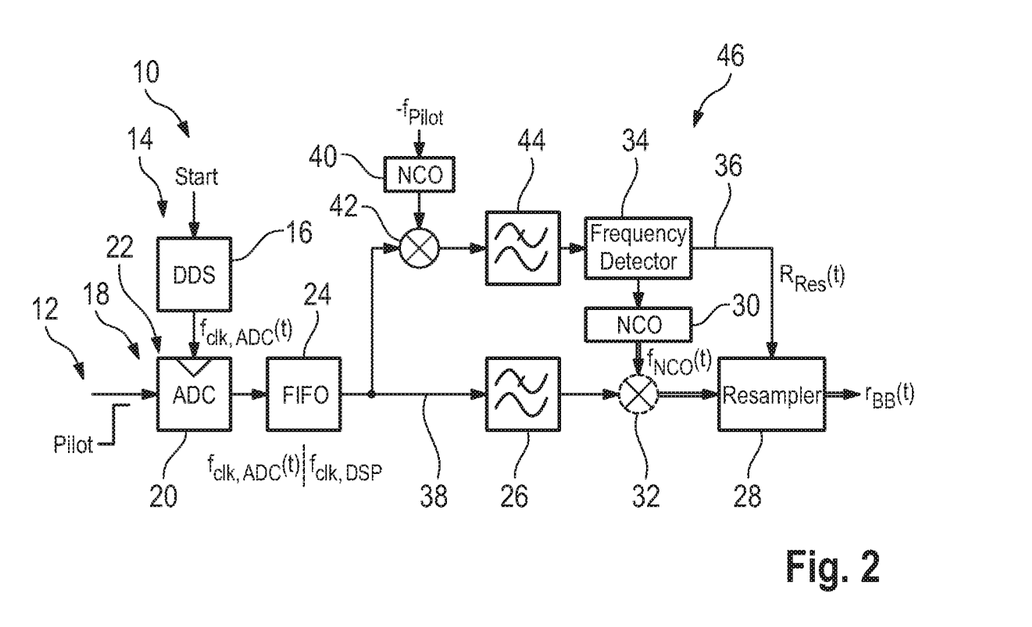
FIG. 2 shows a schematic overview of a representative sampling device according to an embodiment of the present disclosure.

In FIG. 2, another sampling device 10 is shown that is based on the one shown in FIG. 4, as the sampling device 10 comprises the optional mixer 32 and the optional numerically controlled oscillator 30.

Furthermore, the sampling device 10 according to FIG. 2 receives a pilot signal with a known frequency from a pilot signal source as illustrated. The pilot signal is processed by the sampling device 10, for example the converter 18, as will be described later. Hence, the pilot signal is inputted via the input 12 for being processed by the converter 18.

As shown in FIG. 2, the converter 18 is connected with the clock source 14, namely the DDS module 16. However, the clock source 14, namely the DDS module 16, is only connected with the converter 18. In other words, the time-varying clock frequency is only provided to the converter 1 for adapting its sampling rate in a time-variant manner.

Thus, the sampling device 10 according to FIG. 2 differs from the one shown in FIGS. 1, 3 and 4 in that the clock frequency is not directly forwarded to the re-sampler 28 (and the optional NCO 30). Put differently, the clock source may be independent from other sources in the digital signal processor.

However, it is necessary to adapt the resampling factor in a time-variant manner in order to compensate any non-linearities introduced by the converter 18 when processing the input signal.

Accordingly, the sampling device 10 according to FIG. 2 additionally comprises a frequency detector 34 located in a path 36 that is branched off from a receiving path 38 to which the filter 26 and the re-sampler 28 are assigned.

In addition, the sampling device 10 according to FIG. 2 comprises another numerically controlled oscillator 40 that is assigned to another mixer 42. This mixer 42 is located upstream of another filter 44 that is located upstream of the frequency detector 34 within the path 36 branched off from the receiving path 38.

As mentioned previously, the pilot signal source provides the pilot signal that is processed by the sampling device 10. Thus, the pilot signal is converted by means of the converter 18 using the clock frequency received.

The digitized pilot signal is also processed by the FIFO module 24 such that the digitized pilot signal is transferred from the time variant clock domain to the fixed clock domain associated with the clock source 14.

The digitized pilot signal is forwarded to the path 36 branched off as well as the receiving path 38. In the path 36 branched off, the digitized pilot signal is mixed by means of the another mixer 42 and the another NCO 40 receiving the pilot frequency. The signal outputted is filtered by the another filter 44 and forwarded to the frequency detector 34 that receives a representative of the pilot signal, namely the filtered, mixed and digitized pilot signal.

The frequency detector 34 is configured to determine the instantaneous clock frequency that was used by the clock source 14 for modifying the sampling rate of the converter 18 while processing the representative of the pilot signal, namely the filtered, mixed and digitized pilot signal. For doing so, the frequency detector 34 may determine the instantaneous frequency of the pilot signal at the beginning in order to determine the instantaneous clock frequency based on that.

The instantaneous clock frequency, namely the time-variant clock frequency, can be determined by $$f_{clk,ADC}(t) = \frac{f_{Pilot,true}}{f_{Pilot,detected}(t)} * f_{clk,DSP},$$

wherein $f_{Pilot,true}$ is the known frequency of the pilot signal $f_{Pilot,detected}(t)$ is the instantaneous frequency of the pilot signal detected by the frequency detector 34 and f clk,DSP relates to the fixed output sample rate of the sampling device 10.

Generally, the instantaneous frequency of the pilot signal may also be extracted by the sampling device 10. Thus, the pilot signal may be inputted in addition to the input signal such that a superposed signal is processed by the sampling device 10. However, the sampling device 10 is configured to extract the pilot signal, for example the instantaneous frequency of the pilot from the superposed signal due to the another NCO 40, the another mixer 42 and the another filter 42. In some embodiments, these components, namely the another NCO 40, the another mixer 42 and the another filter 42, may be optional.

In any case, the frequency detector 34 is enabled to determine the instantaneous frequency of the pilot signal. Further, the frequency detector 34 is enabled to determine the instantaneous clock frequency, namely the time-variant clock frequency, by taking the known frequency of the pilot signal, the instantaneous frequency of the pilot signal detected by the frequency detector 34 and the fixed output sample rate of the sampling device 10 into account.

The instantaneous clock frequency determined is forwarded to the re-sampler 28 in order to determine its time-variant resampling factor as already described.

Hence, a synchronization between the converter 18 and the re-sampler 28 is not necessary in contrast to the sampling devices 10 according to FIGS. 1, 3 and 4.

Thus, the clock source 14, for example the DDS module 16, and the receiving path 38 can run independently of each other as the clock frequency is extracted from the pilot signal inputted.

The sampling devices 10 according to FIGS. 1 to 4 relate to sampling receivers 46. In some embodiments, the respective converter 18 is established by an analog-to-digital converter 20. Further, the re-sampler 28 provides the fixed output sample rate of the sampling device 10, as the re-sampler 28 is assigned to the output of the sampling device 10. Thus, any non-linearities introduced by the converter 18 are compensated afterwards by the re-sampler 28.

In contrast to the sampling devices 10 shown in FIGS. 1 to 4, FIG. 5 illustrates a sampling device 10 that is established by a sampling transmitter 48.

Figure 5:
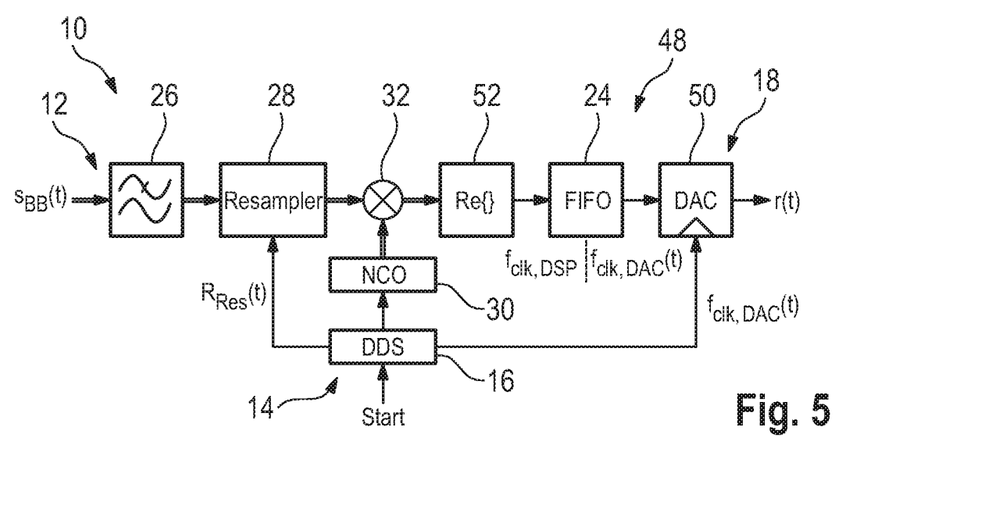
FIG. 5 shows a schematic overview of a representative sampling device according to an embodiment of the present disclosure.

Therefore, the converter 18 is established by a digital-to-analog converter 50 that is assigned to the output of the sampling device 10.

Further, the re-sampler 28 is located upstream of the converter 18 such that a pre-distortion of the signal processed takes place by the re-sampler 28. The re-sampler 28 still has the time-variant resampling factor, as the re-sampler 28 receives the time varying clock frequency from the clock source 14, namely the DDS module 16.

In addition, a processing module 52 is provided that extracts the real portion of the complex input signal for further processing, for example converting.

As the converter 18, namely the digital-to-analog converter 50 abbreviated by DAC, is assigned to the output of the sampling device 10, the converter 50 ensures the fixed output sample rate of the sampling device 10.

Figure 6:
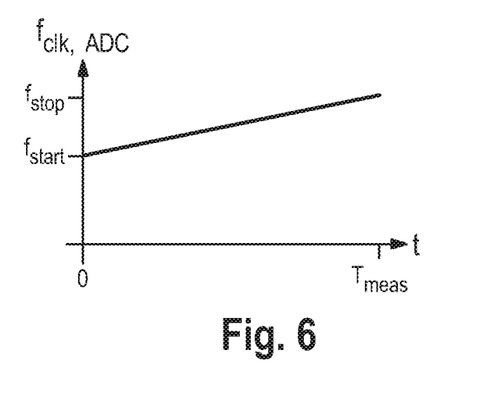
FIG. 6 shows a diagram illustrating a clock frequency varying over time according to a first aspect.
Figure 7:
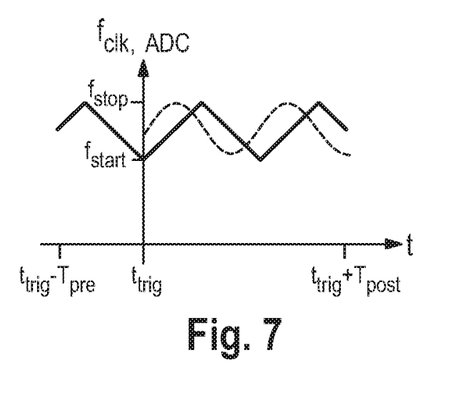
FIG. 7 shows a clock frequency varying over time according to a second aspect.

In FIGS. 6 and 7, two different kinds of clock waveforms are shown that vary over time.

Generally, the clock frequency shall ideally range over a maximum frequency span that, however, is limited by involved phase-locked-loops (PLLs) of the respective converter 18 and an input stage of the digital domain.

Accordingly, the optimum clock frequency is a linear frequency sweep over the measurement time, as shown in FIG. 6. In some embodiments, the clock frequency $f_{clk,ADC}$(t) relates to a linear frequency sweep following the relation:

$$f_{clk,ADC}(t) = f_{start} + (f_{stop} - f_{start}) * \frac{t}{T_{meas}}$$

Figure 8:
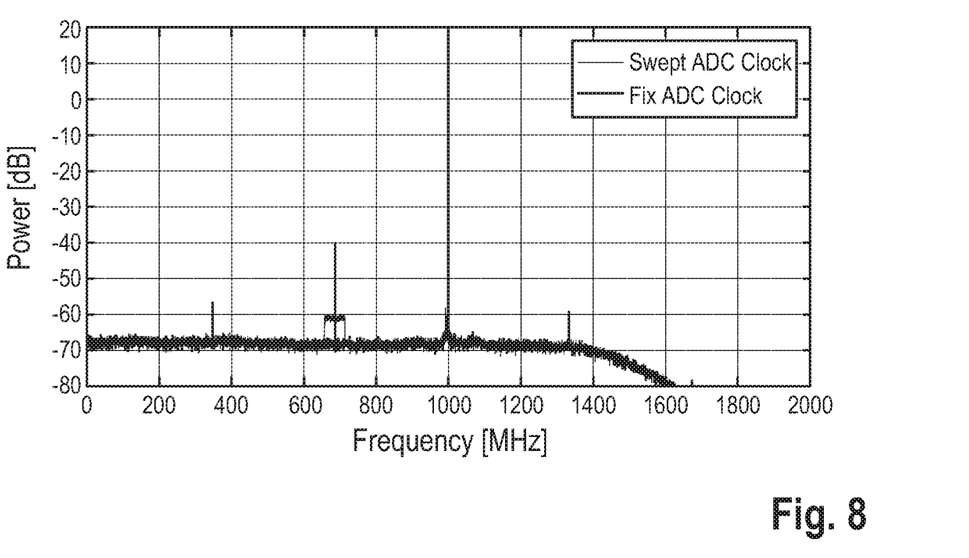
FIG. 8 shows a diagram illustrating the increased spurious-free dynamic range of a sampling device according to the present disclosure compared to a sampling device according to the prior art.

The respective frequency are uniformly distributed, which results in a flat spreading of occurring spurs. Therefore, the spurious free dynamic range can be maximized as illustrated in FIG. 8. In FIG. 8, the increased spurious-free dynamic range of the sampling device 10 using the swept clock frequency is shown in comparison to a converter using a fixed clock frequency.

It becomes obvious that the most prominent spur could be spread over a broader frequency, yielding the increased spurious free dynamic range. Moreover, the two lower spurs could be lowered such that they are located in the noise. In the shown diagram, the clock frequency was swept linearly over 70 MHz.

In FIG. 7, the clock frequency corresponds to a periodic triangle. This specific shape of the clock frequency can be used for triggered measurements with pre-trigger capture. In order to allow the PLLS to follow this specific sweep, namely the triangle sweep, at the corner frequencies, it might be necessary to smooth the respective transitions between the ascending and the decreasing sweep.

Alternatively, the clock frequency varying over time may correspond to a sinusoidal frequency sweep (dashed line in FIG. 7).

In any case, the sampling device 10 provides a significantly increased spurious free dynamic range as illustrated in FIG. 8.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A sampling device, said sampling device comprising:
a clock source that provides a clock frequency;
a converter with a receiving port for receiving said clock frequency; and
a re-sampler located in a digital domain of said sampling device;
wherein said clock source is configured to vary said clock frequency over time;
wherein said clock source is configured to forward said clock frequency to said converter in order to change a sampling rate of said converter in dependency of said clock frequency;
wherein an output sample rate of said sampling device is fixed; and
wherein said re-sampler has a resampling factor that corresponds to the quotient of said fixed output sample rate and an instantaneous clock frequency.

2. The device according to claim 1, wherein said clock frequency varying over time comprises several instantaneous clock frequencies.

3. The sampling device according to claim 1, wherein said clock source is configured to forward said clock frequency to said re-sampler.

4. The sampling device according to claim 1, wherein said clock source is provided by a direct-digital-synthesis circuit configured to perform a direct-digital-synthesis for providing said clock frequency.

5. The sampling device according to claim 4, wherein said direct-digital-synthesis circuit is associated with a digital signal processor.

6. The sampling device according to claim 5, wherein said clock source is independent from other sources in said digital signal processor.

7. The sampling device according to claim 1, wherein said sampling device comprises a pilot signal source for providing a pilot signal of known frequency, said pilot signal being forwarded to said converter.

8. The sampling device according to claim 1, wherein said sampling device comprises a frequency detector in a path branched off, said frequency detector being configured to determine an instantaneous clock frequency.

9. The sampling device according to claim 8, wherein said frequency detector is configured to forward said instantaneous clock frequency determined to said re-sampler.

10. The sampling device according to claim 1, wherein said sampling device comprises a mixer with an input is connected with a numerically controlled oscillator, said numerically controlled oscillator being assigned to said clock source.

11. The sampling device according to claim 1, wherein said sampling device comprises a first-in first-out circuit that is assigned to said converter.

12. The sampling device according to claim 11, wherein said first-in first-out circuit is configured to transfer a time variant clock domain to a fixed clock domain associated with said clock source or wherein said first-in first-out module is configured to transfer a fixed clock domain associated with said clock source to a time variant clock domain.

13. The sampling device according to claim 1, wherein said re-sampler is a polyphase re-sampler.

14. The sampling device according to claim 1, wherein said sampling device comprises a filter.

15. The sampling device according to claim 14, wherein said filter is located upstream of said re-sampler.

16. The sampling device according to claim 1, wherein said clock frequency varying over time corresponds to a linear frequency sweep, a sinusoidal frequency sweep or a periodic triangle.

17. The sampling device according to claim 1, wherein said converter is an analog-to-digital converter or a digital-to-analog converter.

18. The sampling device according to claim 1, wherein said sampling device is a sampling receiver that comprises an analog-to-digital converter, said re-sampler providing said fixed output sample rate of said sampling device.

19. The sampling device according to claim 1, wherein said sampling device is a sampling transmitter that comprises a digital-to-analog converter, said digital-to-analog converter providing said fixed output sample rate of said sampling device.

20. A sampling device, said sampling device comprising:
a clock source that provides a clock frequency;
a converter with a receiving port for receiving said clock frequency; and
a re-sampler located in a digital domain of said sampling device;
wherein said clock source is configured to vary said clock frequency over time;
wherein said clock source is configured to forward said clock frequency to said converter in order to change a sampling rate of said converter in dependency of said clock frequency;
wherein an output sample rate of said sampling device is fixed; and
wherein said clock frequency varying over time corresponds to a linear frequency sweep, a sinusoidal frequency sweep or a periodic triangle.

21. A sampling device, said sampling device comprising:
a clock source that provides a clock frequency;
a converter with a receiving port for receiving said clock frequency; and
a re-sampler located in a digital domain of said sampling device, the re-sampler correcting non-linearities introduced by the converter, the re-sampler having a time-variant resampling factor;
wherein said clock source is configured to vary said clock frequency over time;
wherein said clock source is configured to forward said clock frequency to said converter in order to change a sampling rate of said converter in dependency of said clock frequency; and
wherein an output sample rate of said sampling device is fixed.

* * * * *